United States Patent
Paton et al.

(10) Patent No.: US 6,873,051 B1
(45) Date of Patent: *Mar. 29, 2005

(54) NICKEL SILICIDE WITH REDUCED INTERFACE ROUGHNESS

(75) Inventors: Eric Paton, Morgan Hill, CA (US); Paul Raymond Besser, Sunnyvale, CA (US); Simon S. Chan, Saratoga, CA (US); Fred Hause, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 161 days.

This patent is subject to a terminal disclaimer.

(21) Appl. No.: 10/157,807

(22) Filed: May 31, 2002

(51) Int. Cl.[7] .......................... H01L 23/48; H01L 23/52; H01L 29/40
(52) U.S. Cl. ...................... 257/751; 257/413; 257/755; 257/766; 438/592
(58) Field of Search ................... 257/369, 413, 257/751, 755, 757, 766, 770, 617; 438/299, 303, 592, 652, 683

(56) References Cited

U.S. PATENT DOCUMENTS

| | | | |
|---|---|---|---|
| 5,170,242 A | * 12/1992 | Stevens et al. ............. 257/751 |
| 5,545,574 A | 8/1996 | Chen | |
| 5,648,287 A | * 7/1997 | Tsai et al. .................. 438/305 |
| 5,950,098 A | 9/1999 | Oda et al. | |
| 5,970,370 A | * 10/1999 | Besser et al. ............... 438/586 |
| 6,180,469 B1 | * 1/2001 | Pramanick et al. ......... 438/299 |
| 6,228,730 B1 | * 5/2001 | Chen et al. ................ 438/301 |
| 6,281,102 B1 | * 8/2001 | Cao et al. .................. 438/592 |
| 6,339,021 B1 | * 1/2002 | Tan et al. .................. 438/655 |
| 6,432,805 B1 | * 8/2002 | Paton et al. ............... 438/592 |
| 6,495,460 B1 | * 12/2002 | Bertrand et al. ........... 438/683 |
| 6,602,754 B1 | * 8/2003 | Kluth et al. ............... 438/303 |

OTHER PUBLICATIONS

Tien–Sheng Chao, et al., Performance Improvement of Nickel Salicided n–Type Metal Oxide Semiconductor field Effect Transistors by Nitrogen Implantation, Japanese Journal of Applied Physics, vol. 41, Apr. 1, 2002, pp. L381–L383, XP002281251, whole document.

Wielunski L et al., Alteration of NI Silicide Formation By N Implantation, Applied Physics Letters, American Institute of Physics, New York, US, vol. 38, No. 2, Jan. 15, 1981, pp. 106–108, XP000815002 ISSN 0003–6951, abstract.

Tadashi et al., "A New Contract Plug Technique For Deep–Submicrometer ULSI's employing Selective Nickel Silicidation of Polysilicon With a Titanium Nitride Stopper", IEEE Transactions on Electron Devices, Feb. 1993, pp. 271–377, XP000335344 abstract.

* cited by examiner

Primary Examiner—Amir Zarabian
Assistant Examiner—Khanh Duong

(57) ABSTRACT

Nickel silicide formation with significantly reduced interface roughness is achieved by forming a diffusion modulating layer between the underlying silicon and nickel silicide layers. Embodiments include ion implanting nitrogen into the substrate and gate electrode, depositing a thin layer of titanium or tantalum, depositing a layer of nickel, and then heating to form a diffusion modulating layer containing nitrogen at the interface between the underlying silicon and nickel silicide layers.

5 Claims, 7 Drawing Sheets

NICKEL SILICIDE WITH REDUCED INTERFACE ROUGHNESS

TECHNICAL FIELD

The present invention relates to the fabrication of semiconductor devices, particularly to self-aligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the RxC product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particular advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of the ultra-shallow source/drain junctions.

Upon conducting experimentation and investigation to implement nickel silicide formation, it was discovered that the high resistance nickel disilicide phase ($NiSi_2$) is formed on doped silicon and generates an undesirably rough interface therebetween. Such an interface can range in thickness from 200 Å to 1000 Å and can extend but for a short distance, such as 1 micron. Such interface roughness adversely impacts resistivity and capacitance, and can lead to spiking into the source/drain region or through the gate dielectric layer. This problem can become particularly acute in silicon-on-insulator (SOI) structures wherein such spiking can penetrate through to the underlying buried oxide layer and significantly increase contact resistance.

The formation of a rough interface is schematically illustrated in FIG. 1 wherein gate electrode 11 is formed on semiconductor substrate 10 with gate dielectric layer 12 therebetween. Dielectric sidewall spacers 13 are formed on side surfaces of gate electrode 11. Shallow source/drain extensions 14 and moderately or heavily source/drain region 15 are formed. A layer of nickel is deposited followed by heating to effect silicidation resulting in the formation of nickel silicide layers 16 on the source/drain regions and 15 nickel silicide layer 17 on gate electrode 11. The interface 18 between nickel silicide layers 16 and substrate 10 and the interface 19 between the nickel silicide layer and gate electrode 11, is extremely rough and can generate the aforementioned-problems, including spiking intro the substrate 10 as well as penetration through gate dielectric layer 12.

Conventional wisdom is that $NiSi_2$ forms at a temperature of about 600° C., and that the actual formation temperatures are a function of the linewidth and doping type. However, upon conducting further experimentation and investigation, it was found that $NiSi_2$ can form at a very low temperature, even lower that 450° C., such as 310° C. Since nickel diffuses very rapidly, it is extremely difficult to prevent formation of $NiSi_2$ and, hence, rough interfaces.

Additional problems have been encountered in attempting to implement nickel silicidation. In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p- type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

Accordingly, there, exists a need for semiconductor devices having nickel silicide interconnections with reduced roughness at the interface between nickel silicide layers and underlying silicon, and for enabling methodology. There also exists a need to implement nickel silicide technology without bridging between the nickel silicide layers on the gate electrode and the source/drain regions, particularly when employing silicon nitride sidewall spacers on the gate electrode.

DISCLOSURE OF THE INVENTION

An advantage of the present invention is a semiconductor device comprising nickel silicide layers and reduced roughness at the interface between the nickel silicide layer and underlying silicon.

Another advantage of the present invention is a method of manufacturing a semiconductor device having reduced roughness at the interface between nickel silicide layers and underlying silicon.

A further advantage of the present invention is a method of manufacturing a semiconductor device having nickel silicide contacts on a gate electrode and associated source/drain regions without bridging therebetween along insulative sidewall spacers, notably silicon nitride sidewall spacers.

An additional advantage of the present invention is a semiconductor device having nickel silicide contacts on a gate electrode and on associated source/drain regions without bridging therebetween along insulative sidewall spacers, particularly silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a semiconductor device comprising: a gate electrode, having opposing side surfaces and an upper surface on an upper surface of a semiconductor substrate with a gate dielectric layer therebetween; source/drain regions in the semiconductor substrate on opposite sides of the gate electrodes; dielectric sidewall spacers on opposite sides of the gate electrode; a nitrogen-containing diffusion modulating layer, which impedes nickel diffusion, on the source/drain regions and on the upper surface of the gate electrode; and a layer of nickel silicide on the nitrogen-containing diffusion modulating layers.

Another advantage of the present invention is a method of manufacturing a semiconductor device, the method comprising: forming a silicon gate electrode, having opposing side surfaces and an upper surface, on a silicon semiconductor substrate with a gate dielectric layer therebetween; forming dielectric sidewall spacers on opposite sides of the gate electrode; forming source/drain regions in the semiconductor substrate on opposite sides of the gate electrode; ion implanting nitrogen into the gate electrode and exposed surfaces of the semiconductor substrate on opposite sides of the gate electrode; depositing a layer of titanium or tantalum on the nitrogen implanted gate electrode and on the nitrogen implanted exposed surfaces of the semiconductor substrate; depositing a layer of nickel on the layer of titanium or layer of tantalum; and heating to form: a nitrogen-containing diffusion modulating layer, which impedes nickel diffusion, on the source/drain regions and on the upper surface of the gate electrode; and a layer of nickel silicide on the nitrogen-containing diffusion modulating layers.

Embodiments of the present invention include ion implanting nitrogen into the gate electrode and semiconductor substrate, depositing a layer of titanium or a layer of tantalum, as at a thickness of about 10 Å to about 50 Å, depositing a layer of nickel, as at a thickness of about 100 Å to about 200 Å, and heating, as at a temperature of about 400° C. to about 600° C. During heating, a diffusion modulating layer is formed, as at a thickness of about 10 Å to about 50 Å, comprising nitrided titanium silicide, nitrided nickel silicide, or mixture of nitrided titanium silicide and nitrided nickel silicide, in situations wherein titanium is deposited, or a diffusion modulating layer containing nitrided tantalum silicide, nitrided nickel silicide, or a mixture thereof, in situation wherein a layer of tantalum is deposited. Embodiments of the present invention further include forming a silicon oxide liner on the side surfaces of the gate electrode and upper surface of the semiconductor substrate adjacent opposite side surfaces of the gate electrode, and a dielectric sidewall spacer of silicon nitride thereon.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
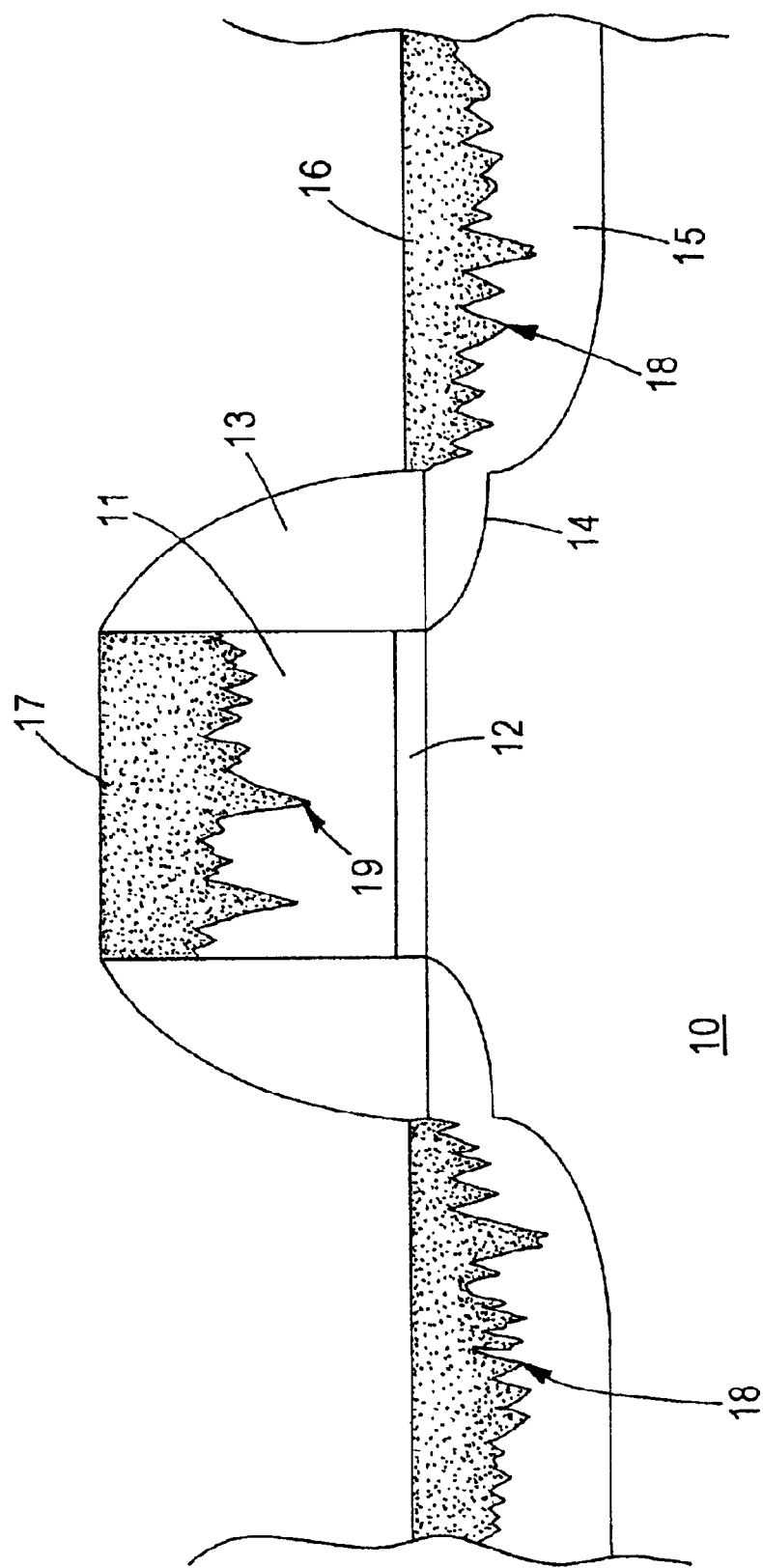
FIG. 1 schematically illustrates problematic surface roughness at the interfaces between nickel silicide layers and underlying silicon.
Figure 2:
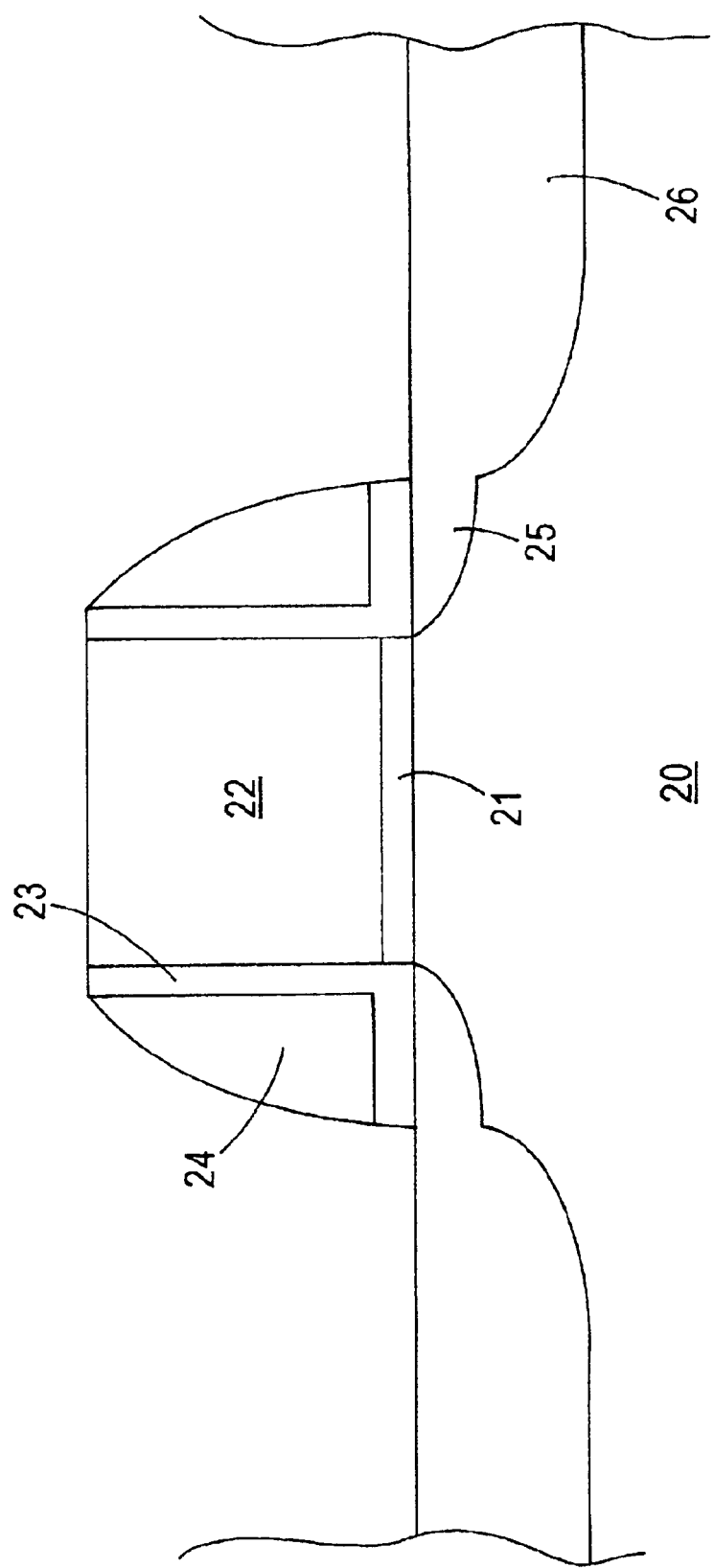
FIGS. 2 through 7 schematically illustrate sequential phases of a method in accordance with an embodiment of the present invention, wherein like features are denoted by like reference numerals.

The present invention addresses and solves problems attendant upon implementing conventional salicide technology employing nickel as the metal for silicidation. Such problems include the formation of an extremely rough interface between nickel silicide layers and underlying silicon, which roughness can lead to spiking and penetration into the source/drain regions, as well as spiking through a gate dielectric layer. Further problems include rapid consumption of silicon in the gate electrode which would destroy the known work function of polycrystalline silicon and highly reliable polycrystalline silicon/silicon oxide interface. Additional problems include nickel silicide bridging along the surface of silicon nitride sidewall spacers between the nickel silicide layer on the gate electrode and nickel silicide layers on associated source/drain regions. It is believed that nickel silicide bridging stems from the reaction nickel with dangling silicon bonds in the silicon nitride sidewall spacer.

The present invention, stems, in part, from the recognition that the interface roughness between nickel silicide layers and underlying silicon is caused by the formation of $NiSi_2$, even at temperatures lower than expected due in part to rapid nickel diffusion, particularly as device geometries shrink deeper into the sub-micron regime. Such surface roughness can range from 200 Å to 1000 Å over various distances, even a very short distance of 1 micron. $NiSi_2$ can form at extremely low temperatures, which low temperatures are an advantage attendant upon nickel silicidation but, unfortunately, result in the formation of a rough interface due to the rapid diffusion of nickel and formation $NiSi_2$. It is challenging to implement nickel silicidation by preventing the formation of $NiSi_2$, particularly due to the rapid diffusion of nickel, even through a layer of cobalt.

In accordance with the present invention, the problem of interface roughness stemming from rapid diffusion of nickel and formation $NiSi_2$ is addressed and solved by forming a diffusion modulating layer at the interface between nickel silicide layers and underlying silicon. Such a diffusion modulating layer impedes the diffusion of nickel into the silicon and further reduces diffusion of silicon into the overlying layer of nickel.

Embodiments of the present invention comprise ion implanting nitrogen into the gate electrode and into exposed surfaces of the silicon substrate on opposite sides of the gate electrode to form nitrogen implanted regions. A layer titanium or tantalum is then deposited, and a layer of nickel deposited thereon. Heating is then conducted, during which a nitrogen-containing diffusion modulating layer is formed at the interface between nickel silicide layers and underlying silicon.

Given the disclosed objectives and guidance herein, the optimum conditions for nitrogen implantation, thicknesses of the individual layers, and heating conditions, can be determined in a particular situation. For example, it was found suitable to ion implant nitrogen at an implantation dosage of about $5 \times 10^{20}$ to about $5 \times 10^{21}$ ions/cm$^2$ and at an implantation energy of about 1 KeV to 5 KeV. Typically, the gate electrode comprises polycrystalline silicon, while the substrate comprises doped monocrystalline silicon. Penetration of the nitrogen into the gate dielectric layer is advantageously deeper than nitrogen penetration into the substrate. Typically, a nitrogen implanted region is formed in the substrate having an impurity concentration peak at a distance of about 50 Å to about 300 Å from the upper surface of the substrate, and a nitrogen implanted region is formed in the gate electrode having an impurity concentration peak at a distance of about 100 Å to about 350 Å from the upper surface of the gate electrode.

A flash layer of titanium or tantalum is deposited on the nitrogen implanted regions of the gate electrode and substrate; typically at a thickness of about 10 Å to 50 Å, and the layer of nickel deposited thereon at a thickness of 100 Å to 200 Å. Heating is then conducted, as at a temperature of about 400° C. to about 600° C. During heating, a nitrogen-containing diffusion modulating layer is formed at the interface between the resulting nickel silicide layers and underlying silicon. When depositing titanium, the nitrogen-containing diffusion modulating layer typically contains a mixture of nitrided titanium silicide and nitrided nickel silicide. When depositing tantalum, the diffusion modulating layer typically contains a mixture of nitrided tantalum silicide and nitrided nickel silicide. The diffusion modulating layer is typically formed at a thickness of about 10 Å to about 50 Å, and the combined thickness of the composite nickel silicide layer and underlying diffusion modulating layer is about 50 Å to 300 Å.

Advantageously, the formation of a diffusion modulating layer which reduces nickel diffusion suppresses the formation of NiSi$_2$ and, hence, significantly reduces interface roughness. In addition, the formation of a diffusion modulating layer in the gate electrode prevents total consumption of the gate electrode by nickel silicide formation and spiking through the gate dielectric layer. An additional benefit of the present invention stems from the reduction in the number of silicon dangling bonds in the outer surface of the silicon nitride sidewall spacers due to nitrogen implantation, thereby reducing nickel silicide bridging between the nickel silicide layer formed on the gate electrode and the nickel silicide layers formed on the source/drain regions.

An embodiment of the present invention is schematically illustrated in FIGS. 2 through 7, wherein similar reference numerals denote similar features. Adverting to FIG. 2, a gate electrode 22, e.g., doped polycrystalline silicon, is formed on semiconductor substrate 20, which can be n- type or p-type, with a gate insulating layer 21 therebetween. Gate insulating layer 21 is typically silicon dioxide formed by thermal oxidation or chemical vapor deposition (CVD). In accordance with embodiments of the present invention, a thin oxide liner 23, as at a thickness of about 130 Å to about 170 Å, is formed on the opposing side surfaces of gate electrode 22. Silicon oxide liner can be formed by plasma enhanced chemical vapor deposition (PECVD) using silane at a flow rate of about 50 to about 100 sccm, N$_2$O at a flow rate of about 1,000 to about 4,000 sccm, an RF power of about 100 watts to about 300 watts, a pressure of about 2.4 Torr. to about 3.2 Torr., and a temperature of about 380° C. to about 420° C., e.g., about 400° C. Silicon oxide liner 23 advantageously prevents consumption of the-gate electrode 21 by silicidation from the side surfaces thereof.

Subsequent to forming silicon oxide liner 23, silicon nitride sidewall spacers 24 are formed by depositing a conformal layer followed by anisotropically etching. Silicon nitride sidewall spacers can be formed by PECVD employing a silane flow rate of about 200 to about 400 sccm, e.g., about 375 sccm, a nitrogen flow rate of about 2,000 to about 4,000 sccm, e.g., about 2,800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers typically have a thickness of about 850 Å to about 950 Å.

Figure 3:
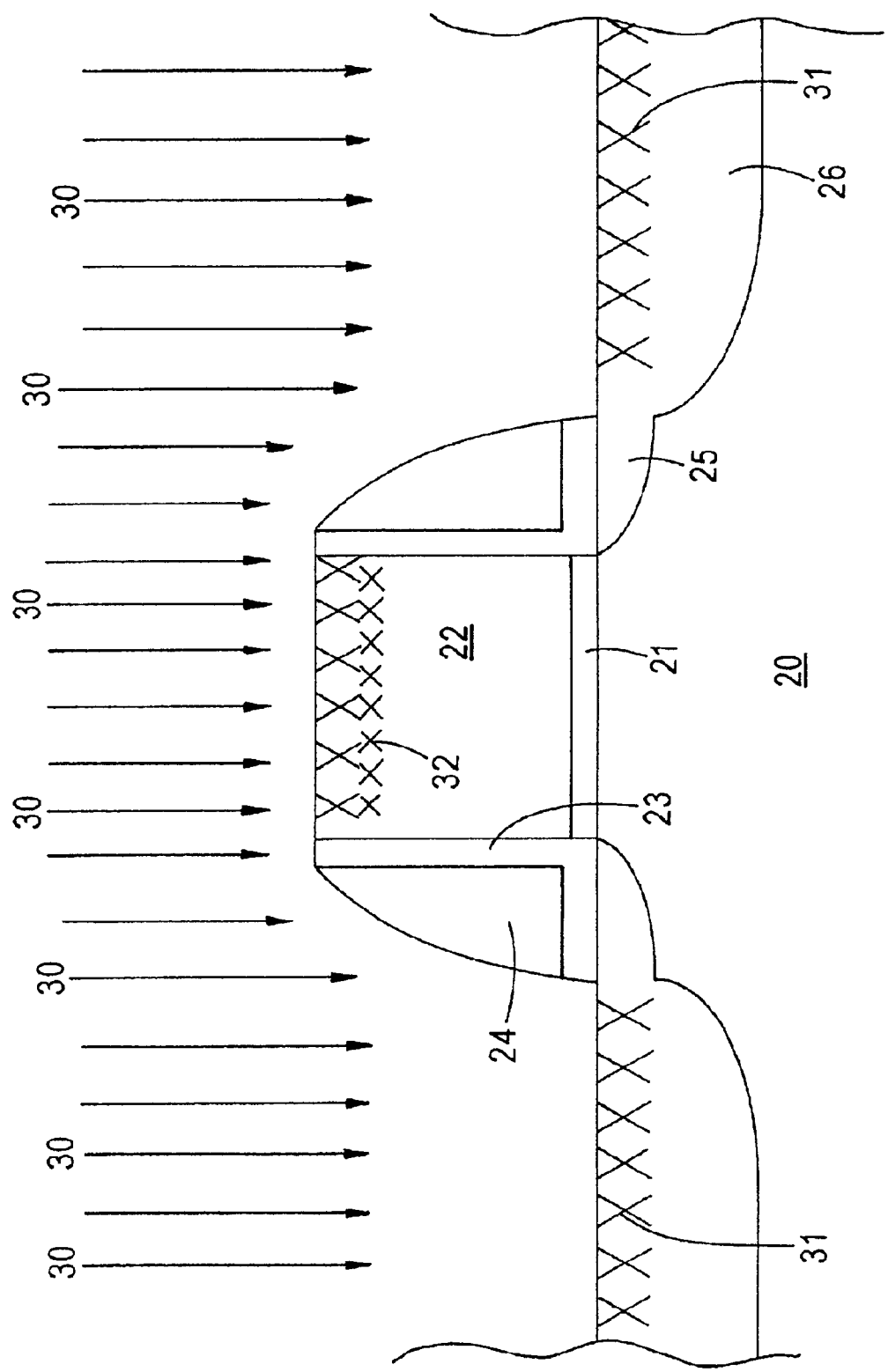

Subsequently, in accordance with embodiments of the present invention, nitrogen is ion implanted into the gate electrode 22 and exposed surfaces of substrate 20 on opposite sides of gate electrode 22, as indicated in FIG. 3 by arrows 30. As a result, nitrogen implanted regions 31 are formed in the substrate and a nitrogen implanted region 32 is formed in upper surface of the gate electrode.

Figure 4:
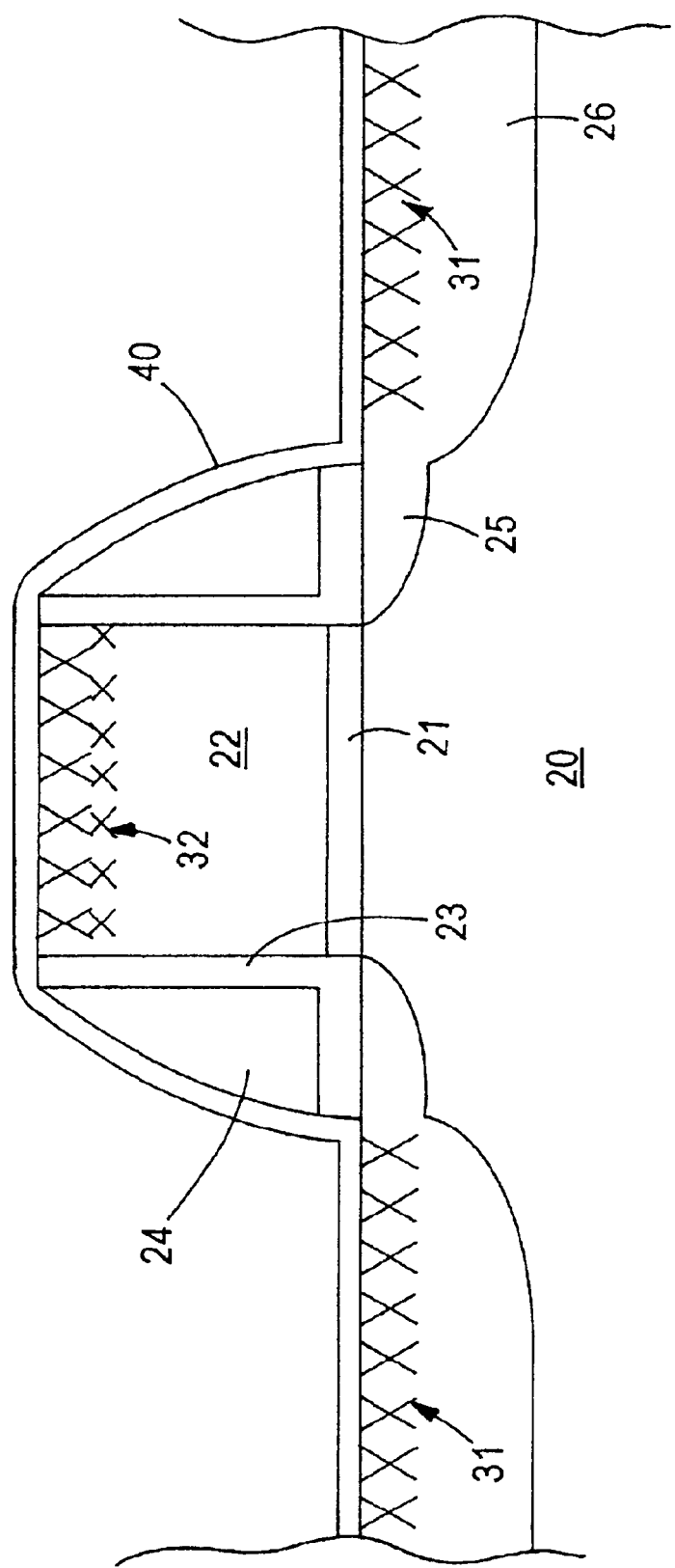
Figure 5:
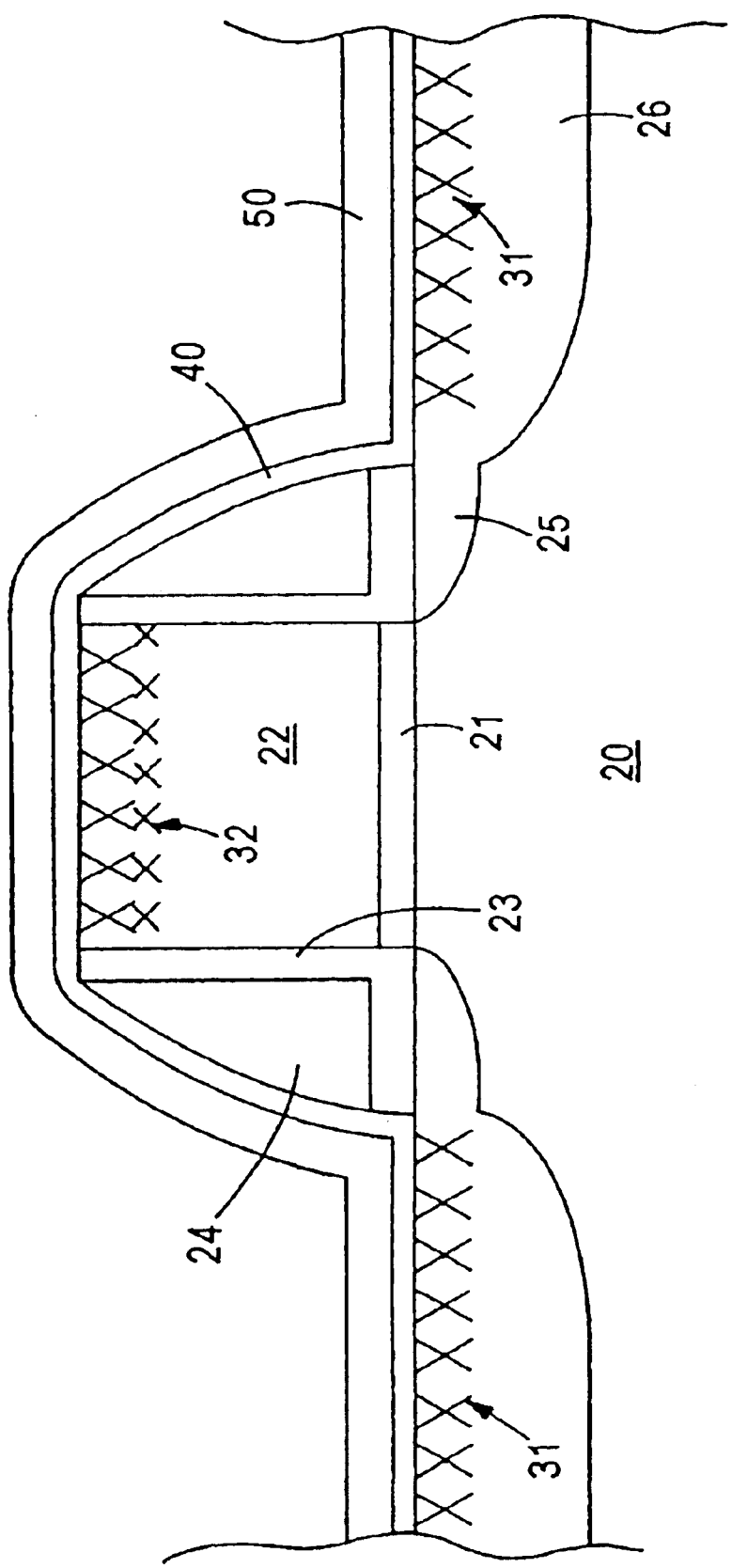

Subsequently, as schematically illustrated in FIG. 4, a layer of titanium or a layer of tantalum 40 is deposited over the gate electrode and substrate. A layer of nickel 50 as shown in FIG. 5, is then deposited over layer 40.

Figure 6:
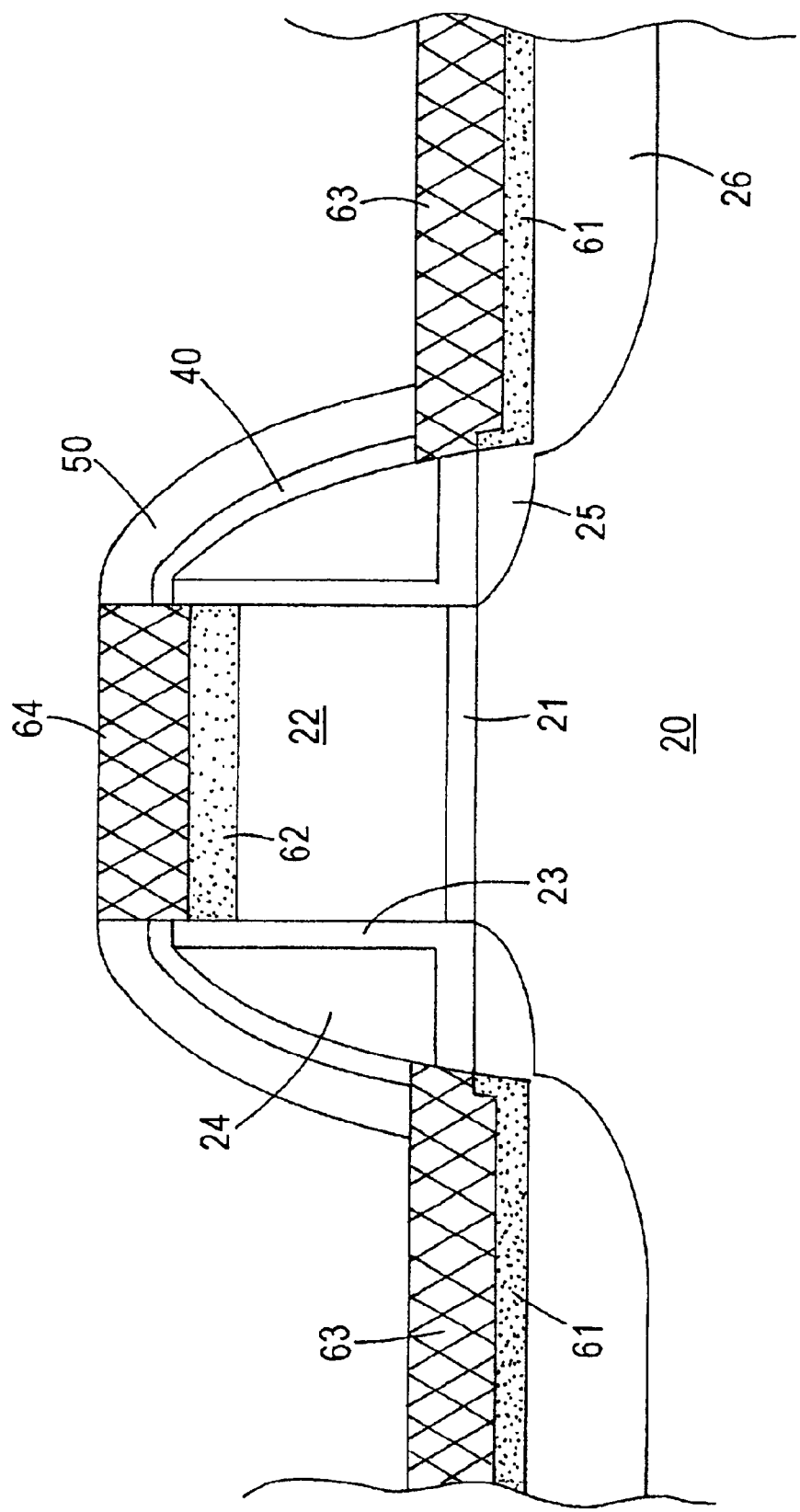
Figure 7:
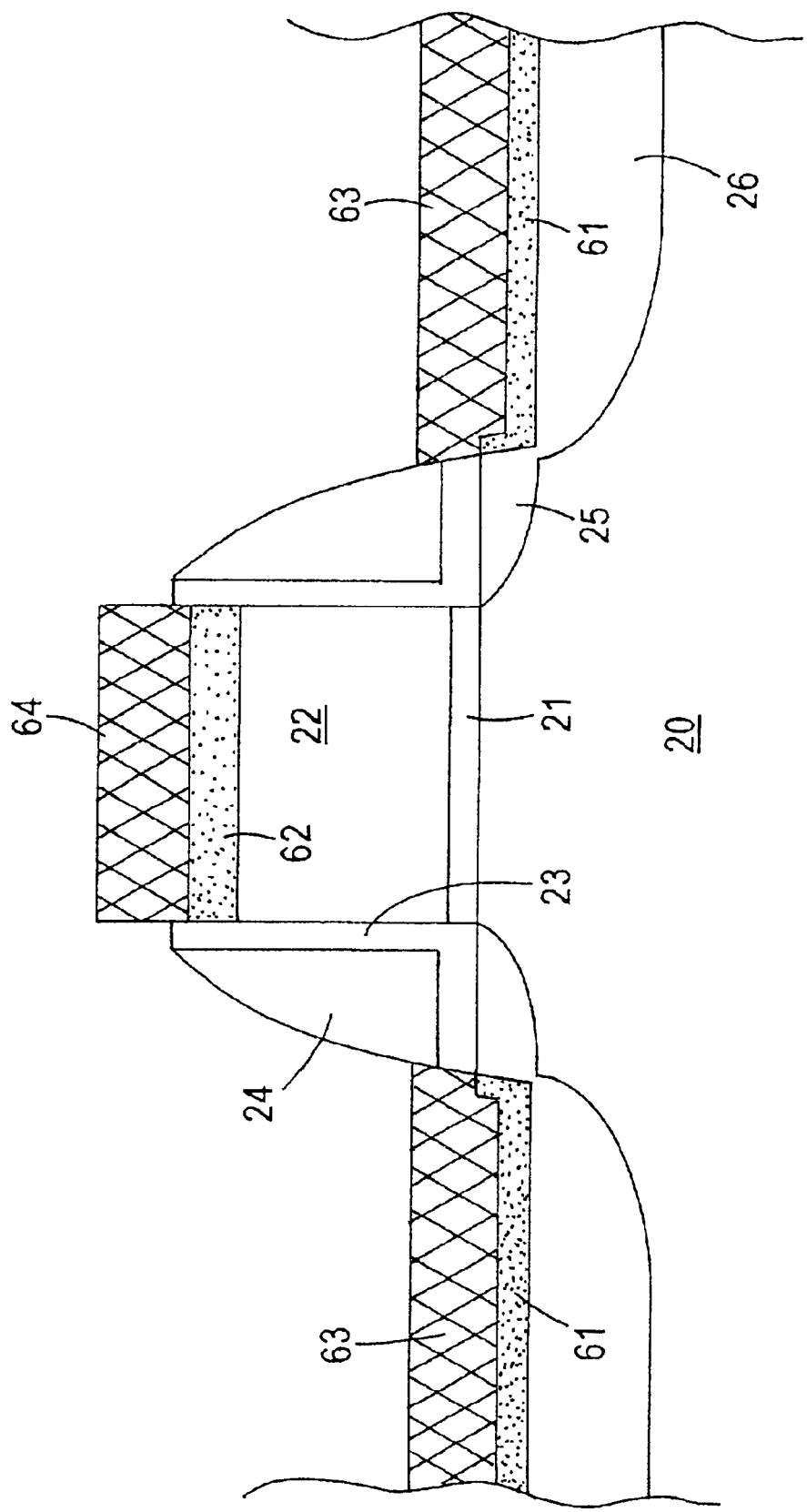

Adverting to FIG. 6, heating is then conducted, whereby a nitrogen-containing diffusion modulating layer 61 is formed in the source/drain regions and a layer of nickel silicide 63 formed thereon. In addition, a nitrogen-containing diffusion modulating layer 62 is formed in the upper surface of the gate electrode, and a layer of nickel silicide 64 formed thereon. In situations wherein layer 40 is titanium, the diffusion modulating regions 61, 62 comprise a mixture of nitrided titanium silicide and nitrided nickel silicide. In situations wherein layer 40 is tantalum, the diffusion modulating regions 61, 62 comprise a mixture of nitrided tantalum silicide and nitrided nickel silicide. Subsequently, as shown in FIG. 7, the unreacted portions of layers 40 and 50 are removed from the sidewall spacer.

In another embodiment, after forming the source/drain regions, a layer of titanium nitride or tantalum nitride is sputter deposited, as by introducing nitrogen while sputtering titanium or tantalum, over the gate electrode and exposed surfaces of the substrate. A layer of nickel is then deposited. Heating is then conducted to form the diffusion modulating layer comprising a mixture of nitrided nickel silicide and nitrided titanium silicide or nitrided tantalum silicide.

The present invention advantageously enables implementing nickel silicidation with significantly reduced interface roughness between nickel silicide layers and underlying silicon, by strategically implanting nitrogen into the substrate and gate electrode, followed by depositing a flash layer of titanium or tantalum, depositing a layer of nickel and then heating. During heating, a nitrided diffusion modulating layer, which impedes diffusion of nickel, is formed on the substrate and gate electrode, separating the nickel silicide layers from the underlying silicon. The diffusion modulating layers are relatively smooth and prevent spiking as well as consumption of the gate electrode by nickel. In addition, nitrogen implantation reduces bridging along silicon nitride sidewall spacers between the nickel silicide layer on the gate electrode and the nickel silicide layers on the associated source/drain regions.

The present invention enjoys industrial applicability in the fabrication of various types semiconductor devices, including semiconductor devices based on SOI substrates. The present invention enjoys particular industrial applicability in fabricating semiconductor devices having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device comprising:

a gate electrode, having opposing side surfaces and an upper surface, on an upper surface of semiconductor substrate with a gate dielectric layer therebetween;

source/drain regions in the semiconductor substrate on opposite sides of the gate electrode;

dielectric sidewall spacers on the opposite sides of the gate electrode;

a nitrogen-containing diffusion modulating layer, which impedes nickel diffusion, on the source/drain regions and on the upper surface of the gate electrode; and a layer of nickel silicide on the nitrogen-containing diffusion modulating layer, wherein the nitrogen-containing diffusion modulating layer contains nitrided titanium silicide, a mixture of nitrided titanium silicide and nitrided nickel silicide, nitrided tantalum silicide, or a mixture of nitrided tantalum silicide and nitrided nickel silicide.

2. The semiconductor device according to claim 1, wherein the nitrogen-containing diffusion modulating layer has a thickness of 10 Å to 50 Å.

3. The semiconductor device of according to claim 1, wherein the nitrogen-containing diffusion modulating layer has a thickness of 10 Å to 50 Å.

4. The semiconductor device according to claim 3, wherein the combined thickness of the nitrogen-containing diffusion modulating layer and nickel silicide layer is 50 Å to 300 Å.

5. The semiconductor device according device according to claim 1, comprising a silicon oxide liner on the opposing side surfaces of the gate electrode and on the upper surface of the semiconductor substrate adjacent the opposite side of the gate electrode, wherein:

the dielectric sidewall spacers comprise silicon nitride; and the dielectric sidewall spacers are on the silicon oxide liner.

* * * * *

UNITED STATES PATENT AND TRADEMARK OFFICE
CERTIFICATE OF CORRECTION

PATENT NO. : 6,873,051 B1
DATED : March 29, 2005
INVENTOR(S) : Eric Paton et al.

It is certified that error appears in the above-identified patent and that said Letters Patent is hereby corrected as shown below:

<u>Column 8,</u>
Line 19, delete the first "device according".

Signed and Sealed this

Thirty-first Day of May, 2005

JON W. DUDAS
*Director of the United States Patent and Trademark Office*